US010268795B2

(12) United States Patent
Chuang et al.

(10) Patent No.: US 10,268,795 B2
(45) Date of Patent: Apr. 23, 2019

(54) METHOD AND SYSTEM FOR TIMING OPTIMIZATION WITH DETOUR PREDICTION

(71) Applicant: TAIWAN SEMICONDUCTOR MANUFACTURING COMPANY LTD., Hsinchu (TW)

(72) Inventors: Yi-Lin Chuang, Taipei (TW); Chih-Tien Chang, Hsinchu (TW); Kuan-Hua Su, Hsinchu (TW); Szu-Ju Huang, Hsinchu County (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 119 days.

(21) Appl. No.: 15/492,326

(22) Filed: Apr. 20, 2017

(65) Prior Publication Data

US 2018/0307790 A1 Oct. 25, 2018

(51) Int. Cl.
*G06F 17/50* (2006.01)
*G06N 20/00* (2019.01)

(52) U.S. Cl.
CPC ...... *G06F 17/5077* (2013.01); *G06F 17/5081* (2013.01); *G06N 20/00* (2019.01)

(58) Field of Classification Search
USPC .......................................... 716/126
See application file for complete search history.

(56) References Cited

U.S. PATENT DOCUMENTS

| 9,659,139 B2 * | 5/2017 | Brown | G06F 17/5081 |
| 2002/0174412 A1 * | 11/2002 | Teig | G06F 17/5072 716/130 |
| 2016/0034305 A1 * | 2/2016 | Shear | G06F 9/50 707/722 |
| 2016/0253445 A1 * | 9/2016 | Pataky | G06F 17/5022 716/104 |

* cited by examiner

*Primary Examiner* — Mohammed Alam
(74) *Attorney, Agent, or Firm* — Juan Carlos A. Marquez; Marquez IP Law Office, PLLC

(57) ABSTRACT

A method for timing optimization is disclosed. The method includes obtaining information on detour locations of a chip by performing a routing operation, establishing, through machine learning, a model that describes a relationship between an image map and the detour locations, generating predicted detour locations based on the model and the image map, determining the probability of detouring in a region of the predicted detour locations, determining a predicted detour net for a path in a region having a high probability of detour, and determining sensitivity of the path.

17 Claims, 13 Drawing Sheets

METHOD AND SYSTEM FOR TIMING OPTIMIZATION WITH DETOUR PREDICTION

BACKGROUND

In electronic design, place and route is a stage in the design of integrated circuits (ICs). The stage is mainly composed of a placement step followed by a routing step. The placement step determines the location of each active element of an IC in a generally limited amount of space. After the placement, the routing step determines all the desired connections and adds wires needed to properly connect the placed components. As semiconductor manufacturing processes continue to thrive and develop, routing has become more and more difficult and can be a major bottleneck in advanced nodes. With the number of cells in a typical design growing exponentially and the electrical properties of metal wires scaling poorly, the competition for preferred routing resources between various interconnects that must be routed is becoming more severe.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
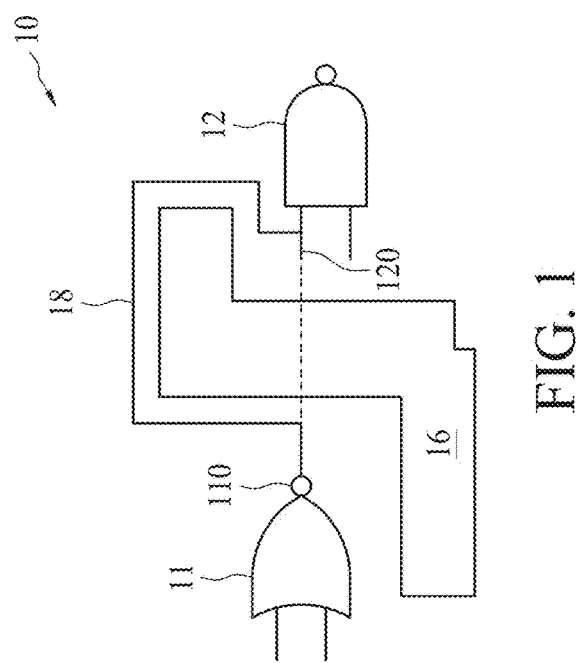
FIG. 1 is a schematic diagram showing a detour route in a chip.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram showing a detour route 18 in a chip 10.

Referring to FIG. 1, the chip 10 includes a first cell 11 having a first pin 110 and a second cell 12 having a second pin 120. Ideally, for electrical connection, the first pin 110 and the second pin 120 are directly connected to each other in a path shown in a dotted line. In practice, however, a congested region 16 may exist between the first cell 11 and the second cell 12, which obstructs a direct connection between the cells. As a result, the first pin 110 and the second pin 120 are connected in a detour path 18 to bypass the congested region 16.

The first cell 11 and the second cell 12 are referred to as standard cells during a design stage. A standard cell contains wires that implement a power supply network, clocks, and signal nets. All these wires share the same set of routing resources. A design is said to exhibit routing congestion when the demand for the routing resources in some region within the design exceeds their supply. Moreover, a congested region might lead to excessive routing detours, or make it difficult to complete all routes.

In exiting approaches, by using electronic design automation (EDA) tools, the timing information of a path is available after performing routing. Specifically, in some existing approaches, when a layout pattern is generated at a placement stage, no detour nets can be precisely predicted and hence no timing impacts can be estimated until a post-layout synthesis and a routing process subsequent to the placement stage are performed. In contrast, in the present disclosure, with the help of machine learning, detour nets can be predicted at the placement stage prior to the routing stage. The result of prediction can be used to reduce timing overheads that would otherwise be caused by detour nets.

Figure 2:
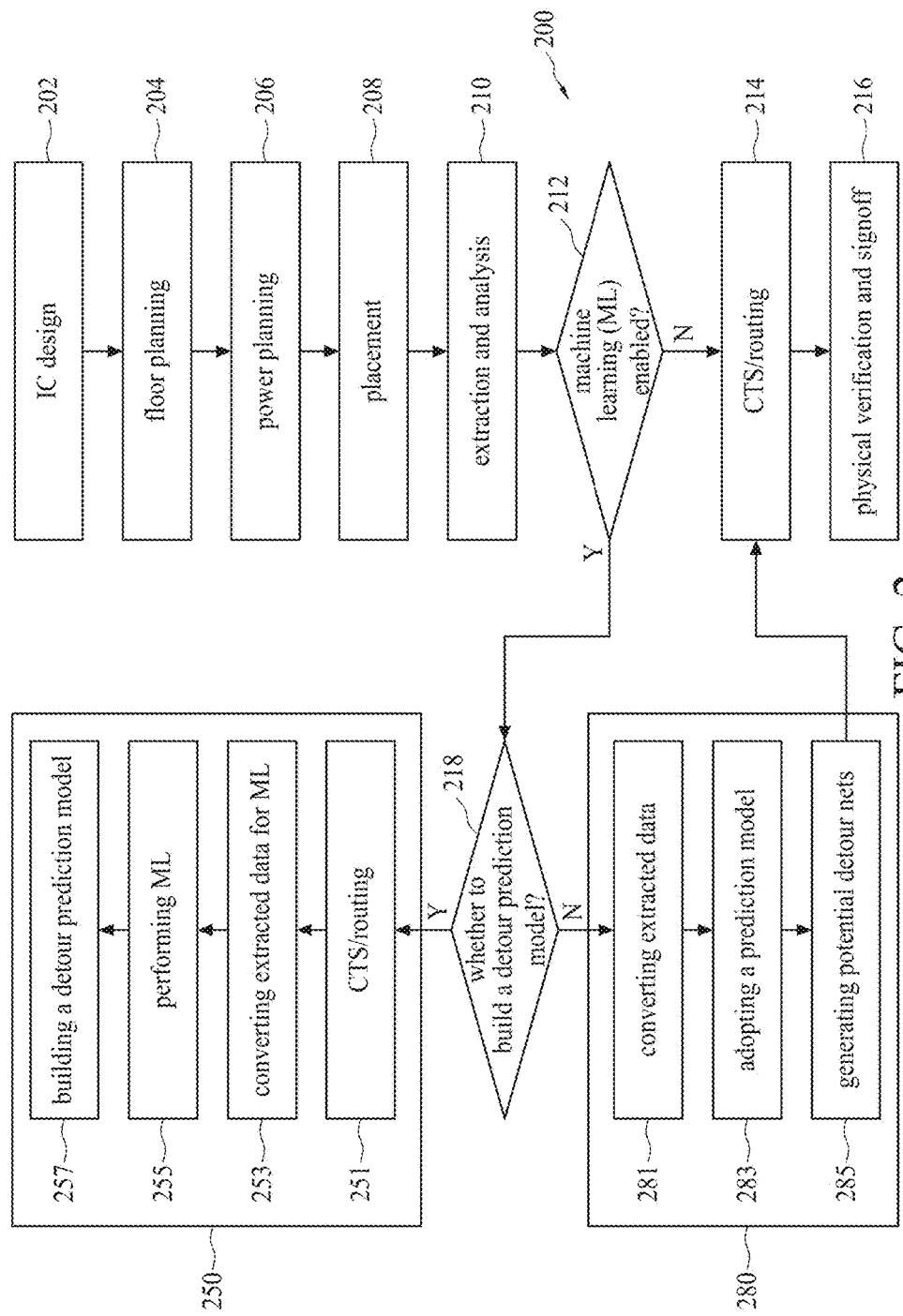
FIG. 2 is a flow diagram of a design flow for an integrated circuit (IC), in accordance with some embodiments.

FIG. 2 is a flow diagram of a design flow for an integrated circuit (IC), in accordance with some embodiments. The design flow aims at implementing at implementing an IC chip design from a high-level specification to a physical layout which is verified for, for example, functionality, timing and power. The design flow utilizes one or more EDA tools to carry out one or more stages in the flow.

Referring to FIG. 2, at an IC design stage 202, a high-level design of the IC chip is provided by a circuit designer. In some embodiments, a gate-level netlist is generated through logic synthesis based on the high-level design and gates in the gate-level netlist are mapped to available cells in a standard cell library. The term "netlist" used herein refers to graphical-based representation such as a schematic or a text-based representation of a circuit or both. In electronic design, a netlist is a description of the connectivity of an electronic circuit. A single netlist is effectively a collection of several related lists. In its simplest form, a netlist consists of a list of the terminals ("pins") of electronic components in a circuit and a list of electrical conductors that interconnect the terminals. A net is a conductor that interconnects two or more component terminals.

At a floor planning stage 204, the gate-level netlist is partitioned into functional blocks and a floorplan for the functional blocks in a design layout of the IC chip is created.

At a power planning stage 206, power meshes such as a VDD power mesh and a VSS power mesh are routed. The power mesh includes several metal layers. Each metal layer includes power lines or power rails running, for example, horizontally or vertically. The metal layers are stacked such that any adjacent metal layers have the power lines or power rails running in, for example, orthogonal directions.

At a placement stage 208, mapped cells of logic gates and registers in the blocks are placed at specific locations in the design layout.

At a parasitic extraction and analysis stage 210, the design layout, which includes information on routing, is analyzed to extract the parasitics in the design layout and accordingly generate a physical netlist.

At a machine learning (ML) stage 200, a number of chips in a same batch of wafers are selected to take machine learning. Specifically, in operation 212, it is determined whether machine learning is enabled for the batch of wafers. If not, a routing process is performed in operation 214. If affirmative, it is determined in operation 218 whether a detour prediction model is to be built. If affirmative, an ML training 250 is performed. If not, an ML prediction 280 is performed.

During the ML training 250, in operation 251, information on post-route detour locations is obtained at a post-placement stage by, for example, routing the selected chips in a routing process. The post-placement stage may perform operations such as clock-tree synthesis (CTS) and routing after the placement stage. Next, in operation 253, placement data extracted at the placement stage 208 is converted into a grayscale image to facilitate a machine learning process. In operation 255, machine learning is executed for the selected chips so that, subsequently in operation 257, a trained model or detour prediction model is built. The trained model describes the relationship between post-route detour locations and the extracted placement data. The trained model may then be stored in a memory.

On the other hand, during the ML prediction 280, in operation 281, placement data extracted at the placement stage 208 is converted into a grayscale image. In operation 283, a trained model that has been built in the ML training 250 is retrieved from the memory and used in conjunction with the converted placement data so as to generate potential detour nets or locations in operation 285. Information on the predicted detour locations is provided to a post-placement stage 214 to facilitate timing optimization for chips in the batch of wafers. As a result, with the machine learning process 200, prior to an actual routing process 214, detour nets can be predicted.

At the routing stage 214, interconnects between the placed cells in the design layout are routed based on the information on predicted detour locations. The routed design layout is passed to the parasitic extraction and analysis stage 210 which generates a physical netlist of the design layout, and performs timing analysis on the physical netlist. Based on an analysis result passed back to the routing stage 214, post-route optimization can be performed on the design layout to achieve timing closure of the IC chip design.

Subsequently, at a physical verification and signoff stage 216, layout-versus-schematic (LVS) is performed on a physical netlist generated from the design layout to ensure correspondence of the design layout to the gate-level netlist. Further, design rule check (DRC) is performed on the design layout to ensure the design clean of, for example, electrical issues and lithographic issues for manufacturing. Incremental fixing can be performed to achieve final signoff of the IC chip design before tape-out.

The design flow in FIG. 2 is exemplary. Other sequence of the stages, partition of the stages, and/or additional stages before, between or after the stages shown are within the applicable scope of the present disclosure.

Figure 3:
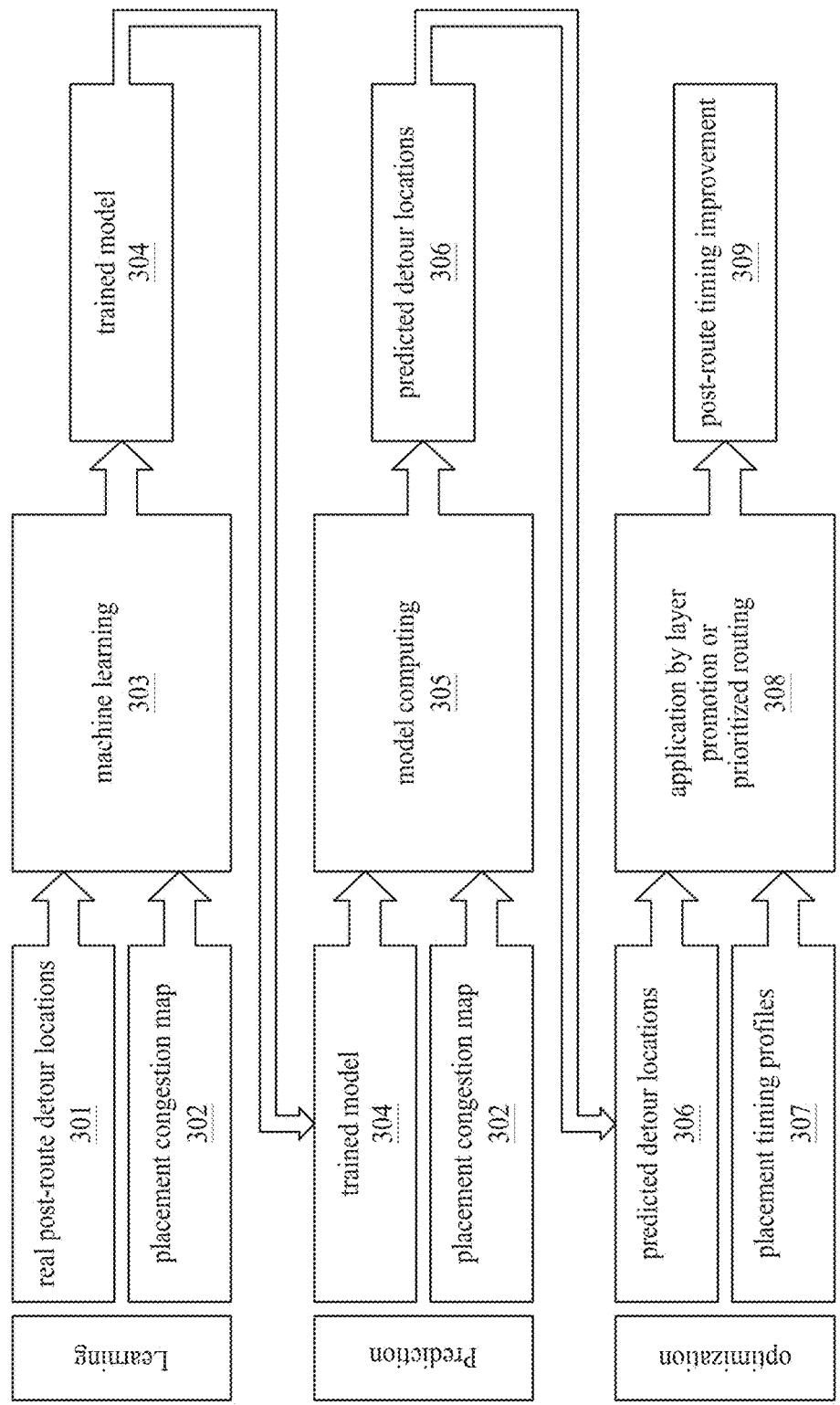
FIG. 3 is a diagram showing a method of timing optimization, in accordance with some embodiments.

FIG. 3 is a diagram showing a method of timing optimization, in accordance with some embodiments.

Referring to FIG. 3, the method includes a learning stage, a prediction stage and an optimization stage. At the learning stage, information on post-route detour locations 301 and a congestion map 302 are input to a machine learning system 303. In an embodiment, the information on post-route detour locations 301 is obtained by routing a number of chips in a batch of wafers. As the number increases, the result of the machine learning, for example, information on predicted detour locations becomes more accurate. Moreover, the congestion map 302 is derived from a placement data obtained at the placement stage 208 in FIG. 2. The machine learning system 303 includes, for example, a neural network based (NN-based) training system. In an embodiment, the machine learning system 303 includes a convolutional neural network (CNN) training system. In response to the information on post-route detour locations 301 and the congestion map 302, the machine learning system 303 outputs a trained model 304 that describes the relationship between the post-route detour locations 301 and the congestion map 302. For example, the trained model 304 maps the placement data to the post-route detour locations 301.

At the prediction stage, in response to the trained model 304 and the congestion map 302, a computing device 305 such as a processor determines whether a region in the congestion map 302 is a "hotspot" region, which has a relatively high probability of detouring. Based on the determined hotspot regions, the computing device 305 then generates information on predicted detour locations 306.

At the optimization stage, based on the information on predicted detour locations 306 and information on timing profiles 307 that is derived from the placement data, a sensitivity value of each predicted detour net is determined. A net having a smaller sensitivity value is routed via a higher layer in a routing process 308 than that of a net having a greater sensitivity value. In addition, the nets associated with the predicted detour locations 306 are ranked in an order of prioritization based on the sensitivity value so that a net having a higher priority is routed in the routing process 308 prior to a net having a lower priority. Effectively, the timing performance of the chip is enhanced.

Figure 4:
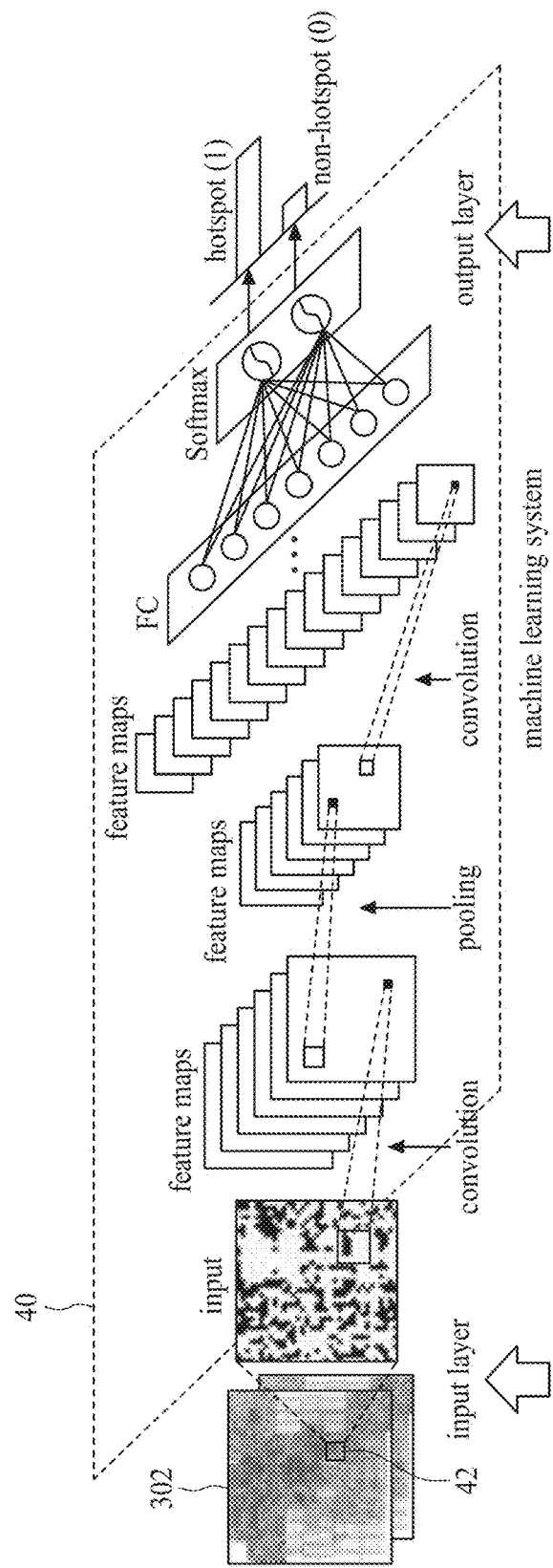
FIG. 4 is a schematic diagram showing an exemplary machine learning process in the method of FIG. 3.

FIG. 4 is a schematic diagram showing an exemplary machine learning process in the method of FIG. 3.

Referring to FIG. 4, a convolutional neural network (CNN) 40 is employed in the exemplary machine learning process. Since CNN has been widely used for image classification, its function and structure are only briefly discussed. The CNN 40 performs several convolutions and pooling (or sub-sampling) processes on an input image, and outputs a class or a probability of classes that best describes the image. In the present embodiment, the congestion map 302 serves as an input image. FIG. 4 exemplarily illustrates how a clip or process window 42 in the congestion map 302 is processed by the CNN 40. In an embodiment, each clip 42 has a size of approximately 35 um×35 um.

During the CNN training, each of the convolution and pooling processes may have a different process window and produce a different number of feature maps. A fully connected (FC) layer looks at what high level features most strongly correlate to a particular class and have particular weights so that the correct probabilities for the different classes can be determined by the computing device 305 in FIG. 3 by means of, for example, a softmax function. In the present embodiment, a region having a probability of one (1) is classified as a hotspot region, while a region having a probability of zero (0) is classified as a non-hotspot region. In other embodiments, a region may have a probability ranging between 0 and 1, or having a value in a different range.

Figure 5:
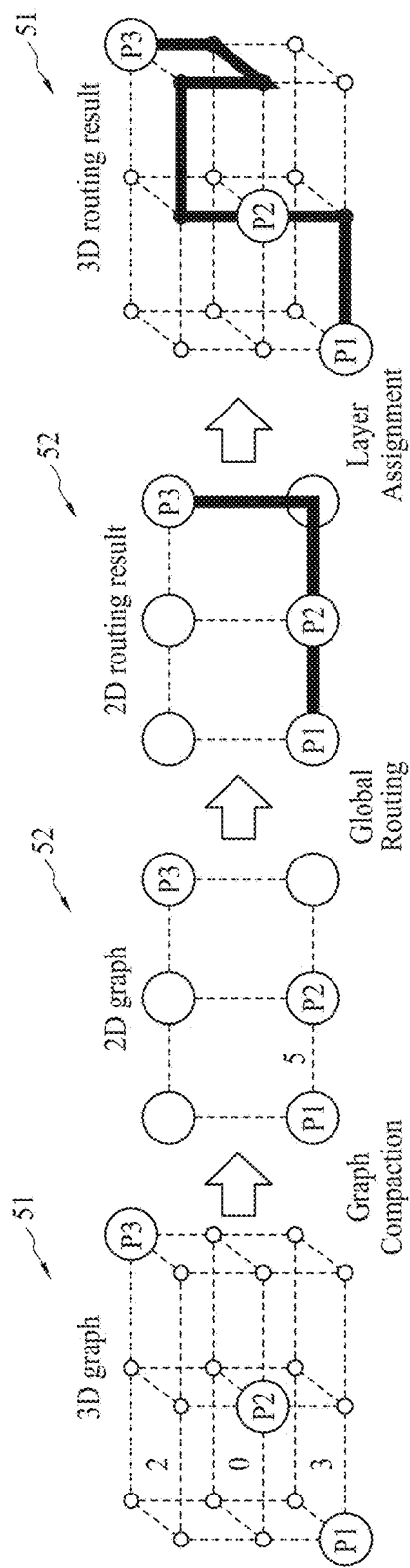
FIG. 5 is a schematic diagram showing an exemplary process of determining the number of nets available for global routing cells in a congestion map.

FIG. 5 is a schematic diagram showing an exemplary process of determining the number of nets available for global routing cells in a congestion map. A congestion map is converted into a grayscale image before input to a machine learning system. In some embodiments, the number of nets available at a certain placement region and the number of nets actually routed at this region are used to facilitate the conversion of a congestion map into a grayscale image.

Referring to FIG. 5, a three-dimensional (3D) region 51 in a congestion map includes global routing cells (hereinafter the "Gcells") P1, P2 and P3 disposed in different layers. Numbers 2, 0 and 3 indicate the number of nets available for going through in respective layers in the 3D region 51. By means of graph compaction, the 3D region 51 is converted into two-dimensional (2D) region 52. Likewise, a number 5 indicates the number of nets available for passing in the 2D region 52. The graph compaction facilitates to determine the number of available nets. Subsequently, the number of nets actually routed for passing Gcells is obtained after performing a global routing. An exemplary 2D routing path that connects the Gcells P1, P2 and P3 is shown in the 2D region 52. The 2D region 52 is restored back to the 3D one by means of layer assignment. The graph compaction, global routing and layer assignment may be performed with the help of EDA tools. Information on the number of available nets and actually routed nets is used to convert the congestion map, which will be discussed in detail below.

Figure 6:
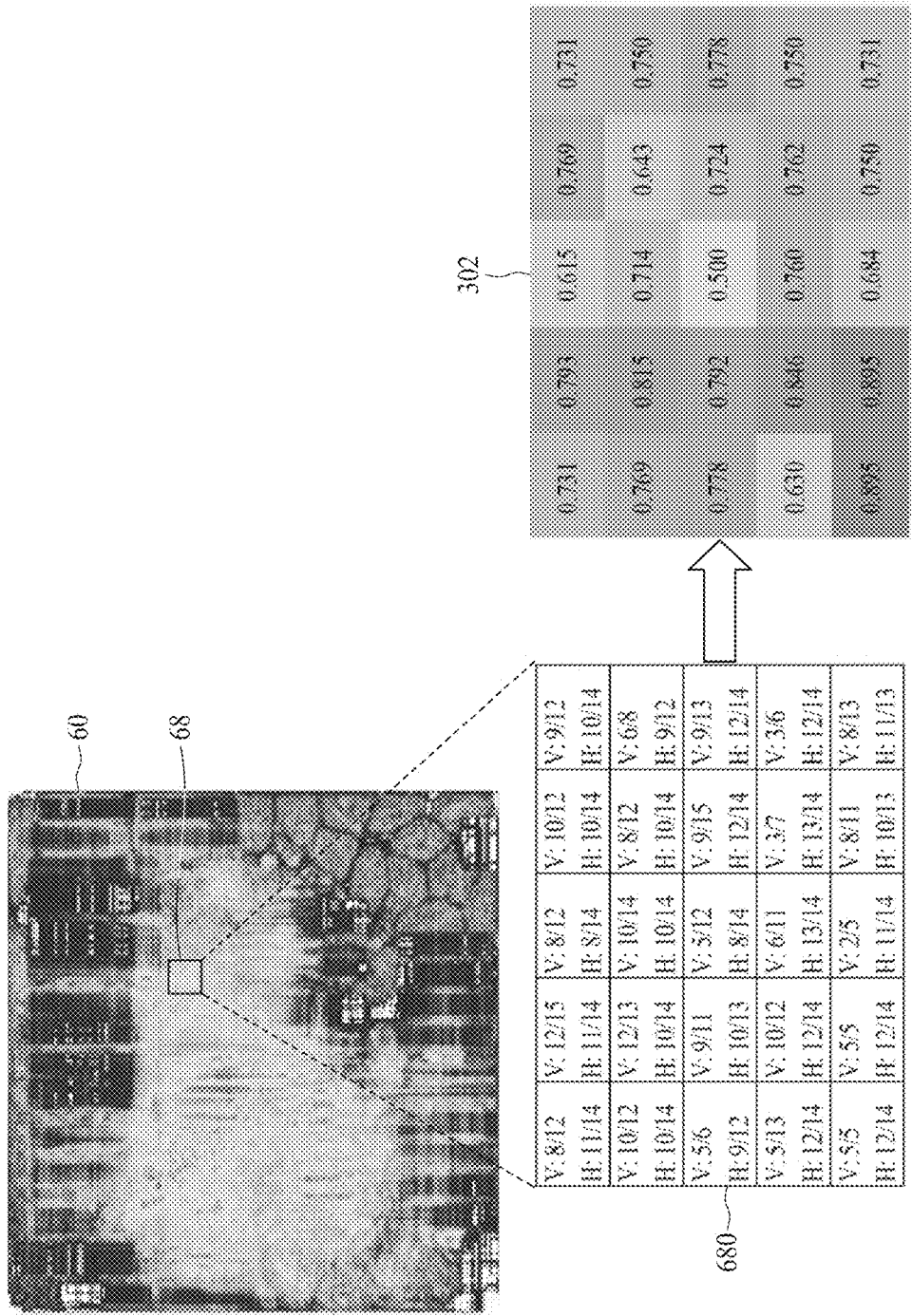
FIG. 6 is a schematic diagram showing a method of converting a congestion map into a grayscale image, in accordance with some embodiments.

FIG. 6 is a schematic diagram showing a method of converting a congestion map into a grayscale image, in accordance with some embodiments.

Referring to FIG. 6, information on the number of available nets and actually routed nets for Gcells in a region 68 of a congestion map 60 is shown. For example, with respect to the upper leftmost pixel 680, the denominator (12) of the fraction 8/12 represents the number of available nets that can pass the particular Gcell in a first (for example, vertical) direction, while the nominator (8) represents the number of actually routed nets that pass the particular Gcell in the vertical direction, denoted as V: 8/12. In addition, the number of available nets in a second (for example, horizontal) direction is 14 while the number of actually routed nets in the horizontal direction is 11, denoted as H: 11/14. The first direction is different from the second direction and is substantially orthogonal to the second direction. In an embodiment, a grayscale value (GV) of the pixel 680 is determined based on a summation (S1) of the number of actually routed nets in both the vertical and horizontal directions and a summation (S2) of the number of available nets in both the vertical and horizontal directions. For example, GV is calculated by dividing S1 by S2 as follows.

$$GV=S1/S2=(8+11)/(12+14)=0.731.$$

By determining the GV of each pixel in the congestion map 60 based on the information on the number of available nets and the number of actually routed nets, a grayscale image 302 of the congestion map 60 for input to a machine learning system is obtained.

Figure 7A:
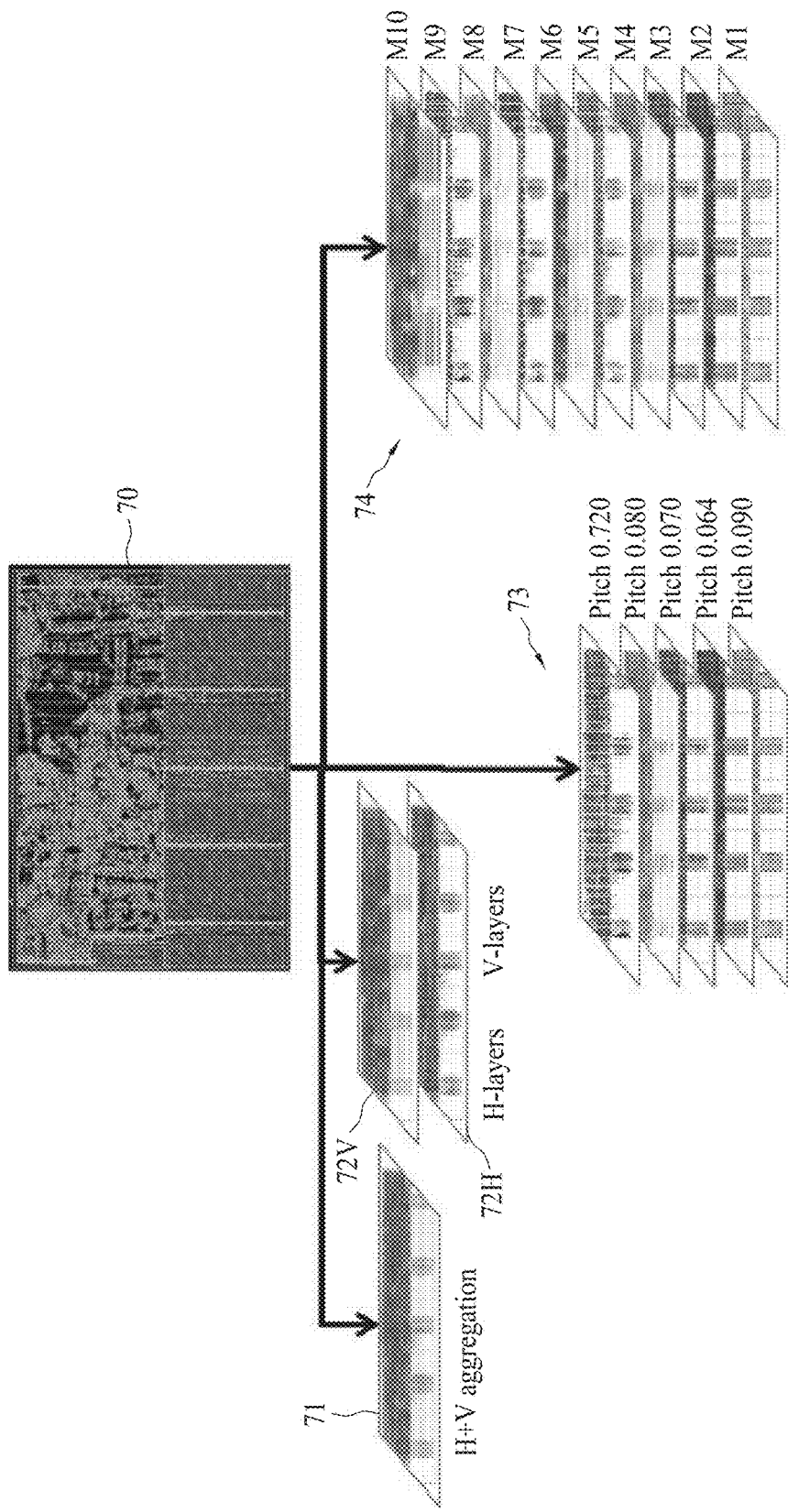
FIGS. 7A and 7B are diagrams showing methods of providing grayscale images based on different sources, in accordance with some embodiments.
Figure 7B:
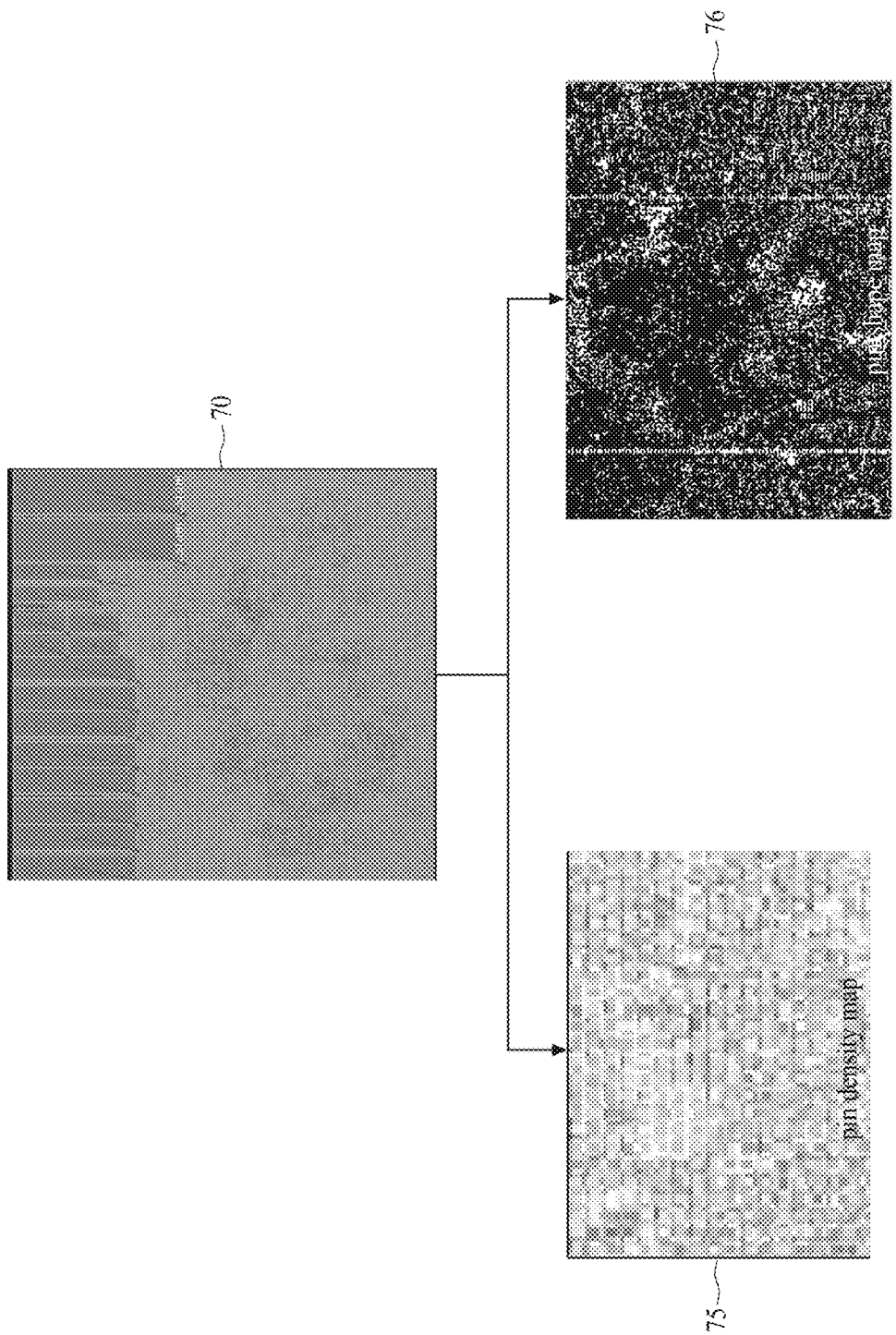

FIGS. 7A and 7B are diagrams showing methods of providing grayscale images based on different sources, in accordance with some embodiments.

Referring to FIG. 7A, a grayscale image 71 for an input to a machine learning system may be generated in a similar fashion as the grayscale image 302 described and illustrated with reference to FIG. 6. That is, the grayscale image 71 is prepared based on a summation (S1) of the number of actually routed nets in both the vertical and horizontal directions and a summation (S2) of the number of available nets in both the vertical and horizontal directions.

Unlike the single grayscale image 71, in an embodiment a pair of grayscale images 72V and 72H may be provided as an input to a machine learning system. The grayscale image 72V is generated based on the number (Nv1) of actually routed nets in the vertical direction and the number (Nv2) of available nets in the vertical direction. For example, a grayscale value GVv of a pixel is calculated by dividing Nv1 by Nv2. Likewise, the grayscale image 72H is generated based on the number (Nh1) of actually routed nets in the horizontal direction and the number (Nh2) of available nets in the horizontal direction. For example, a grayscale value GVh of a pixel is calculated by dividing Nh1 by Nh2.

In another embodiment, grayscale images 73 may be prepared by sorting a placement data 70 by pitch, resulting in a number of pitch maps. Generally, a larger pitch is used for devices in a higher interconnection layer in a chip, while a smaller pitch is used for devices in a lower interconnection layer. Subsequently, each of the pitch maps is converted into a grayscale image in a similar fashion as the grayscale image 71 or the grayscale images 72V and 72H.

In yet another embodiment, grayscale images 74 may be prepared by sorting the placement data 70 by interconnection layer, resulting in a number of layer maps. Likewise, each of the layer maps is converted into a grayscale image in a similar fashion as the grayscale image 71 or the grayscale images 72V and 72H.

Referring to FIG. 7B, a pin density map 75 that describes pin distribution in the placement data 70 may be used as an input to a machine learning system. A grayscale value of a pixel in the pin density map 75 is determined based on a summation of areas (Ap) of pins in a region and the area (Ar) of the region. For example, the grayscale value is calculated by dividing Ap by Ar.

In addition, a pin shape map 76 that describes whether there is a pin in a region of the placement data 70 may also be used as an input to a machine learning system. In an embodiment, a value one (1) is assigned to a pixel if a pin exists, while a value zero (0) is assigned to the pixel if no pin exists.

In some embodiments, one or more of the grayscale images 71, 72V, 72H, 73, 74, the pin density map 75 and the pin shape map 76 is used as an input to a machine learning system. The more input to the machine learning system, the better training performance of the machine learning and hence the more accurate in predicted detour locations.

Figure 8:
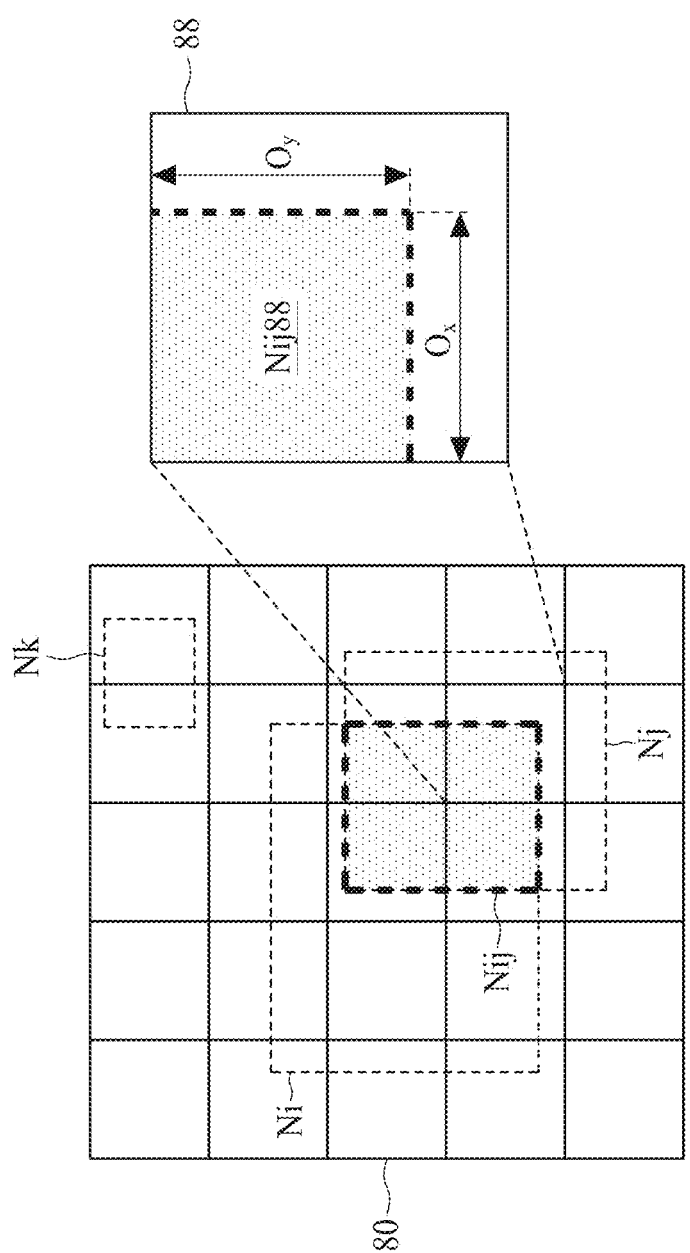
FIG. 8 is a diagram showing a method of determining a potential detour region, in accordance with some embodiments.

FIG. 8 is a diagram showing a method of determining a potential detour region, in accordance with some embodiments.

After hotspot regions are determined by the computing device 305 in FIG. 3, a detour route for a hotspot region is determined by, for example, using the Steiner Tree Wire Length (STWL) technique. Referring to FIG. 8, net boxes Ni, Nj and Nk in an exemplary region 80 can then be determined. For illustration, the exemplary region 80 has a size of 5 Gcells×5 Gcells (or 5 bins×5 bins). Each of the net boxes Ni, Nj and Nk represents a smallest box area to contain a detour route. An overlapped area of such net boxes can be considered to be a region having a high potential of detouring. In the present embodiment, the net boxes Ni and Nj overlaps each other in a region Nij. The probability of detouring for a Gcell 88 in the overlapped region Nij is determined based on the number (Nd) of detour nets in the Gcell 88 and an area (Ao=Ox×Oy) of an overlapped portion Nij88 in the Gcell 88. For example, the probability of detouring for the Gcell 88 is calculated by deviding Nd by Ao. Consequently, by determining the probability of detouring for Gcells in overlapped regions, regions of high detour potential are identified.

Figure 9:
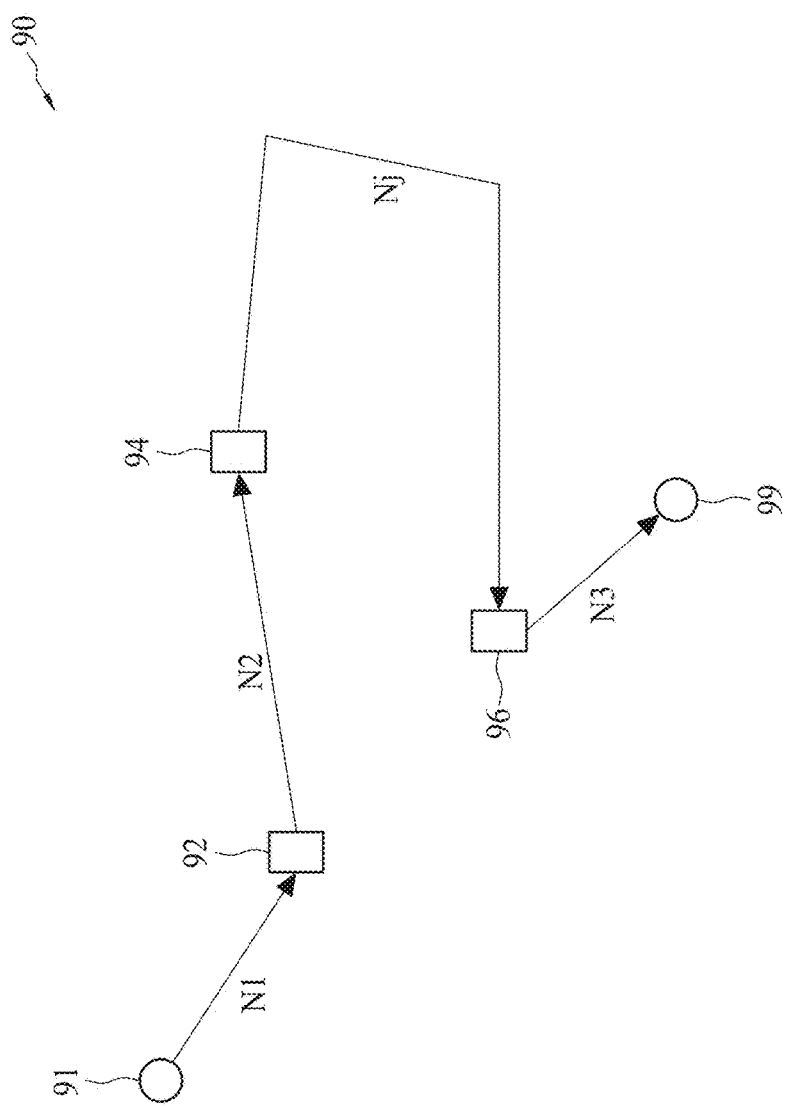
FIG. 9 is a schematic diagram showing a method of determining a detour net in a potential detour region, in accordance with some embodiments.

FIG. 9 is a schematic diagram showing a method of determining a predicted detour net in a potential detour region, in accordance with some embodiments.

After regions of high detour potential are identified, referring to FIG. 9, in a detour route or path 90 a detour net Nj that passes through a region of high detour potential is determined. The detour route 90 may start from a pin 91 to another pin 99 via intermediate logics 92, 94 and 96 such as buffers or multiplexers. In the present embodiment, the detour route 90 includes a first net N between the pin 91 and the logic 92, a second net N2 between the logics 92 and 94, the predicted detour net Nj between the logics 94 and 96, and a third net N3 between the logic 96 and the pin 99. Sensitivity (SNj) of the predicted detour net Nj is determined based on the lengths of nets in the detour route 90 and timing profiles associated with the detour route 90. For example, SNj is expressed in an equation below.

$$SNj=[(LN1+LN2+LN3+LNj)\times(Spath-Sdesign)]/LNj$$

where LN1, LN2, LN3 and LNj represent the length of the nets N1, N2, N3 and Nj, respectively, Spath represents a timing slack such as a setup slack of the detour route 90, and Sdesign represents the worst case of slack in the chip.

The sensitivity SNj is function of the length of the predicted detour net Nj. A larger LNj means a longer detour net and hence a smaller SNj. Accordingly, the smaller the sensitivity SNj, the more critical the detour net Nj. A more critical net has a higher priority for detouring prevention. In an embodiment, a net having a higher priority is routed in a routing process prior to another net having a lower priority. In another embodiment, a predicted detour net having a smaller sensitivity is routed via a higher interconnection layer than that a predicted detour net having a larger sensitivity in a routing process. Effectively, the timing performance of the chip is enhanced.

Figure 10:
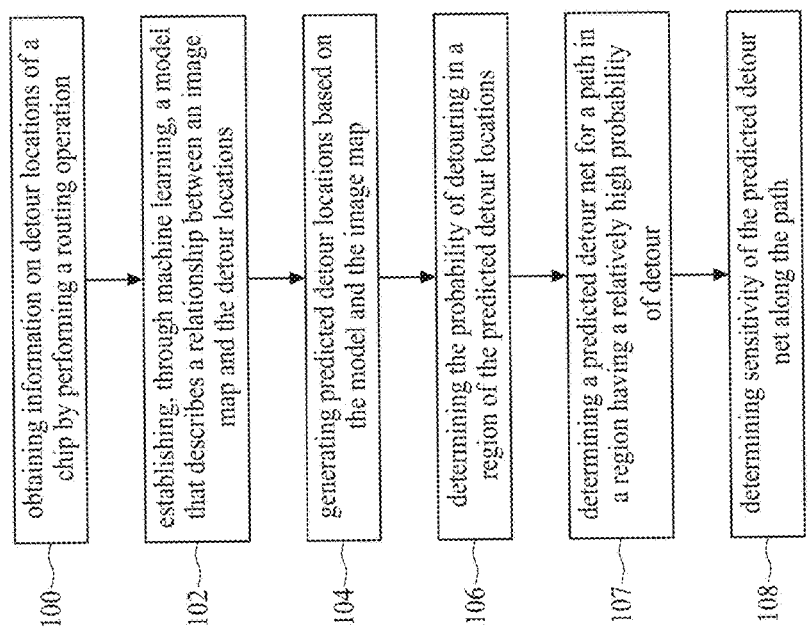
FIG. 10 is a flow diagram showing a method of timing optimization, in accordance with some embodiments.

FIG. 10 is a flow diagram showing a method of timing optimization, in accordance with some embodiments.

Referring to FIG. 10, in operation 100, information on detour locations of a chip is obtained by performing a routing operation.

In operation 102, through machine learning, a model that describes a relationship between an image map and the detour locations is established. In some embodiments, an image map for input to a machine learning system includes one or more of the grayscale images 71, 72V, 72H, 73, 74, the pin density map 75 and the pin shape map 76.

In operation 104, predicted detour locations are generated based on the model and the image map.

In operation 106, the probability of detouring in a region of the predicted detour locations is determined.

In operation 107, a predicted detour net for a detour path in a region having a relatively high probability of detour is determined.

In operation 108, sensitivity of the predicted detour net is determined. In addition, the sensitivity of each of predicted detour nets along the path is determined.

Figure 11:
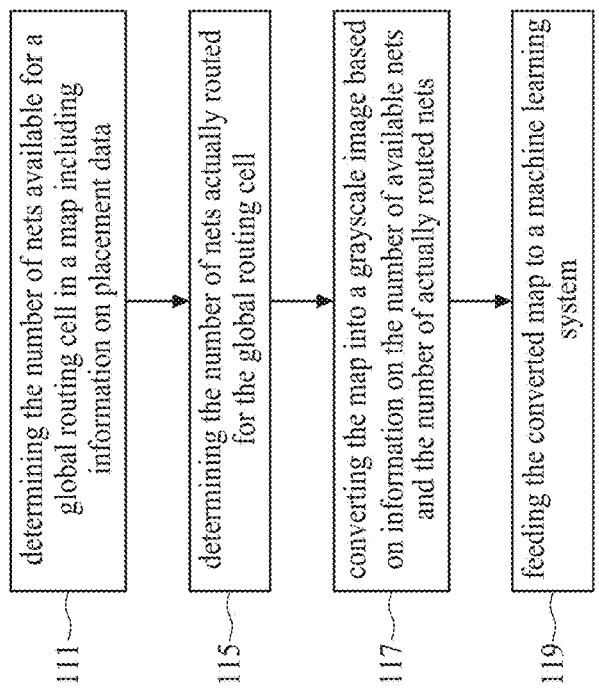
FIG. 11 is a flow diagram showing a method of timing optimization, in accordance with some embodiments.

FIG. 11 is a flow diagram showing a method of timing optimization, in accordance with some embodiments.

Referring to FIG. 11, in operation 111, the number of nets available for a global routing cell in a map including information on placement data is determined.

In operation 115, the number of nets actually routed for the global routing cell is determined.

In operation 117, the map is converted into a grayscale image based on information on the number of available nets and the number of actually routed nets.

In operation 119, the converted map is input to a machine learning system.

Figure 12:
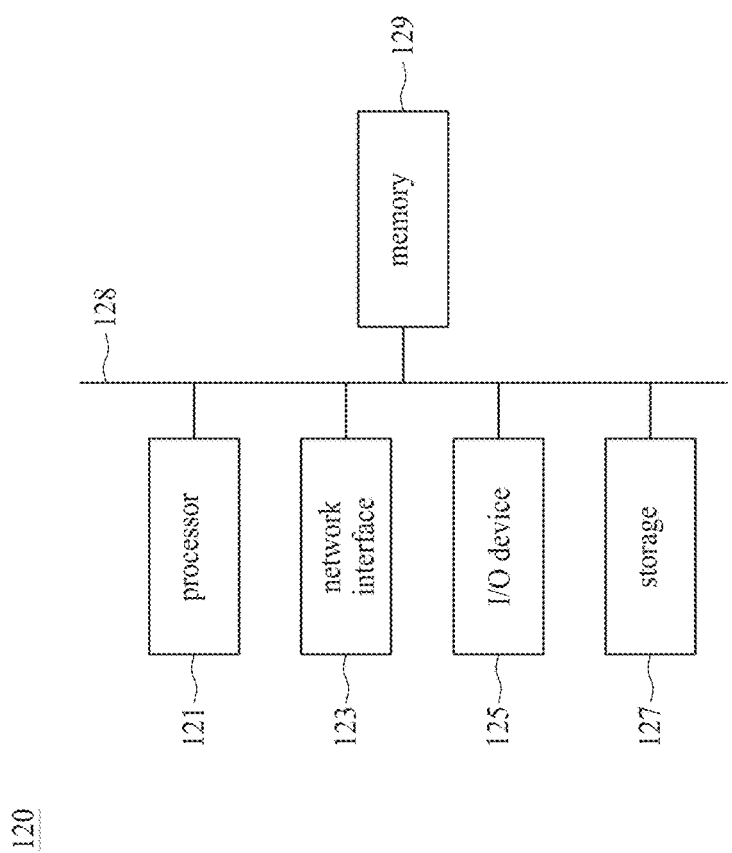
FIG. 12 is a block diagram of a system for timing optimization, in accordance with some embodiments.

FIG. 12 is a block diagram of a system 120 for timing optimization, in accordance with some embodiments.

Referring to FIG. 12, the system 120 includes a processor 121, a network interface 123, an input and output (I/O) device 125, a storage device 127, a memory 129, and a bus or network 128. The bus 128 couples the network interface 123, the I/O device 125, the storage device 127 and the memory 129 to the processor 121.

The processor 121 is configured to execute program instructions that include a tool configured to perform a method as described and illustrated with reference to FIG. 10 or 11 or both. Accordingly, the tool is configured to execute the operations including obtaining information on detour locations of a chip by performing a routing operation, establishing, through machine learning, a model that describes a relationship between an image map and the detour locations, generating predicted detour locations based on the model and the image map, determining the probability of detouring in a region of the predicted detour locations, determining a predicted detour net for a path in a region having a relatively high probability of detour, and determining sensitivity of the path. Moreover, the tool is also configured to execute the operations including determining the number of nets available for a global routing cell in a map including information on placement data, determining the number of nets actually routed for the global routing cell, converting the map into a grayscale image based on information on the number of available nets and the number of actually routed nets, and feeding the converted map to a machine learning system.

The network interface 123 is configured to access program instructions and data accessed by the program instructions stored remotely through a network (not shown).

The I/O device 125 includes an input device and an output device configured for enabling user interaction with the system 120. In some embodiments, the input device comprises, for example, a keyboard, a mouse, and other devices. Moreover, the output device comprises, for example, a display, a printer, and other devices.

The storage device 127 is configured for storing program instructions and data accessed by the program instructions.

In some embodiments, the storage device 127 comprises, for example, a magnetic disk and an optical disk.

The memory 129 is configured to store program instructions to be executed by the processor 121 and data accessed by the program instructions. In some embodiments, the memory 129 comprises a random access memory (RAM) and/or some other volatile storage device and/or read only memory (ROM) and/or some other non-volatile storage device.

In some embodiments, the present disclosure provides a method of timing optimization. The method includes obtaining information on detour locations of a chip by performing a routing operation, establishing, through machine learning, a model that describes a relationship between an image map and the detour locations, generating predicted detour locations based on the model and the image map, determining the probability of detouring in a region of the predicted detour locations, determining a predicted detour net for a path in a region having a high probability of detour, and determining sensitivity of the path.

In some embodiments, the present disclosure also provides a method of timing optimization. The method includes obtaining placement data of a chip by performing a placement operation, determining the number of nets available for a global routing cell in a map including information on the placement data, determining the number of nets actually routed for the global routing cell in the map including information on the placement data, converting the map into a grayscale image based on information on the number of available nets and the number of actually routed nets, and feeding the converted map to a machine learning system.

In some embodiments, the present disclosure provides a system for timing optimization. The system includes one or more processors and one or more programs including instructions which, when executed by the one or more processors, cause the system to obtain information on detour locations of a chip by performing a routing operation, establish, through machine learning, a model that describes a relationship between an image map and the detour locations, generate predicted detour locations based on the model and the image map, determine the probability of detouring in a region of the predicted detour locations, determine a predicted detour net for a path in a region having a high probability of detour, and determine sensitivity of the path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method implemented in an electronic design automation system, comprising the steps of:
    performing a routing operation to generate routing and detour location data for a chip;
    generating a data model in response to a machine learning process that describes a relationship between an image map of the chip and the detour location data;
    determining predicted detour locations based on the data model and the image map;
    determining the probability of detouring in a region of the predicted detour locations;
    determining a predicted detour net for a path in a region having a high probability of detour;
    determining sensitivity of predicted detour nets along the path; and
    routing a detour net for the chip in response to the determined sensitivity of the predicted detour nets,
    wherein
    the step of generating the data model further comprises:
        receiving the routing and detour location data;
        receiving a map of circuit element placement derived from placement data; and
        converting the map into the image map, and
    the map includes a congestion map, and the step of converting further comprises:
        obtaining information on the number of nets available in a region each in a first direction and in a second direction different from the first direction; and
        obtaining information on the number of nets actually routed in the region each in the first direction and in the second direction.

2. The method according to claim 1 further comprising:
    determining a grayscale value of a pixel in the congestion map based on a summation of the number of actually routed nets in both the first and second directions and a summation of the number of available nets in both the first and second directions.

3. The method according to claim 1 further comprising:
    determining a grayscale value of a pixel in the congestion map based on the number of actually routed nets in the first direction and the number of available nets in the first direction, and generating a first image map; and
    determining a grayscale value of a pixel in the congestion map based on the number of actually routed nets in the second direction and the number of available nets in the second direction, and generating a second image map.

4. The method according to claim 1 further comprising:
    sorting the congestion map by pitch, resulting in a number of pitch maps; and
    converting each of the pitch maps into the image map.

5. The method according to claim 1 further comprising:
    sorting the congestion map by interconnection layer, resulting in a number of layer maps; and
    converting each of the pitch maps into the image map.

6. The method according to claim 1, wherein the map includes at least one of a pitch map or a pin shape map.

7. The method according to claim 1, wherein the determining the probability of detouring further comprises:
    determining net boxes in the region that each contains a detour net; and
    identifying an overlapped region of the net boxes.

8. The method according to claim 1, wherein the sensitivity is function of the length of the predicted detour net.

9. The method according to claim 1 further comprising:
    routing a predicted detour net having a smaller sensitivity prior to a predicted detour net having a larger sensitivity.

10. The method according to claim 1 further comprising:
    routing a predicted detour net having a smaller sensitivity via a higher interconnection layer than that of a predicted detour net having a larger sensitivity.

11. A method implemented in an electronic design automation system, comprising:

performing a placement operation to generate placement data of a chip;

determining the number of nets available for a global routing cell in a map of the chip including information on the placement data;

determining the number of nets actually routed for the global routing cell in the map including information on the placement data;

converting the chip map into a grayscale image based on information on the number of available nets and the number of actually routed nets;

feeding the converted chip map to a machine learning system; and routing a detour net for the chip in response to the machine learning system processing the converted chip map, wherein the step of converting further comprises:

determining a grayscale value of a pixel in the chip map based on the number of actually routed nets in a vertical direction and the number of available nets in the vertical direction, and generating a first image map;

determining a grayscale value of a pixel in the chip map based on the number of actually routed nets in a horizontal direction and the number of available nets in the horizontal direction, and generating a second image map;

sorting the chip map by pitch, resulting in a number of pitch maps; and converting each of the pitch maps into a grayscale image.

12. The method according to claim 11, wherein the converting further comprises:

determining a grayscale value of a pixel in the map based on a summation of the number of actually routed nets in both a vertical direction and a horizontal direction and a summation of the number of available nets in both the vertical direction and the horizontal direction.

13. The method according to claim 11, wherein the converting further comprises:

sorting the map by interconnection layer, resulting in a number of layer maps; and converting each of the pitch maps into a grayscale image.

14. The method according to claim 11, wherein the converting further comprises:

sorting the map by interconnection layer, resulting in a number of layer maps; and converting each of the pitch maps into a grayscale image.

15. An electronic design automation system, comprising one or more processors and one or more programs including instructions which, when executed by the one or more processors, cause the system to:

perform a routing operation to generate placement data of a chip;

generate a data model in response to a machine learning process that describes a relationship between an image map of the chip and the detour locations;

generate predicted detour locations based on the data model and the chip image map;

determine the probability of detouring in a region of the predicted detour locations;

determine a predicted detour net for a path in a region having a high probability of detour;

determine sensitivity of predicted detour nets along the path; and route a detour net for the chip in response to the determined sensitivity of the predicted detour nets, wherein the generating of the data model further comprising:

receiving the routing and detour location data;

receiving a map of circuit element placement derived from placement data; and converting the map into the image map, and the map includes a congestion map, and the converting of the map further comprising:

obtaining information on the number of nets available in a region each in a first direction and in a second direction different from the first direction; and obtaining information on the number of nets actually routed in the region each in the first direction and in the second direction.

16. The system according to claim 15, further comprising instructions which, when executed by the one or more processors, cause the system to:

route a predicted detour net having a smaller sensitivity prior to a predicted detour net having a larger sensitivity.

17. The system according to claim 15 further comprising instructions which, when executed by the one or more processors, cause the system to:

route a predicted detour net having a smaller sensitivity via a higher interconnection layer than that of a predicted detour net having a larger sensitivity.

* * * * *